(12) United States Patent
Schubert et al.

(10) Patent No.: US 10,326,043 B2
(45) Date of Patent: Jun. 18, 2019

(54) SOLID-STATE TRANSDUCER DEVICES WITH OPTICALLY-TRANSMISSIVE CARRIER SUBSTRATES AND RELATED SYSTEMS, METHODS, AND DEVICES

(71) Applicant: Micron Technology, Inc., Boise, ID (US)

(72) Inventors: Martin F. Schubert, Mountain View, CA (US); Vladimir Odnoblyudov, Danville, CA (US); Scott D. Schellhammer, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/729,487

(22) Filed: Oct. 10, 2017

(65) Prior Publication Data

US 2018/0033909 A1 Feb. 1, 2018

Related U.S. Application Data

(60) Continuation of application No. 14/706,827, filed on May 7, 2015, now Pat. No. 9,812,606, which is a (Continued)

(51) Int. Cl.
*H01L 33/00* (2010.01)
*H01L 31/02* (2006.01)
(Continued)

(52) U.S. Cl.
CPC ...... *H01L 33/0025* (2013.01); *H01L 25/0753* (2013.01); *H01L 25/167* (2013.01); (Continued)

(58) Field of Classification Search
CPC ............ H01L 33/0025; H01L 33/2232; H01L 33/486; H01L 33/62
See application file for complete search history.

(56) References Cited

U.S. PATENT DOCUMENTS 6,270,236 B1  8/2001  Brussog
7,067,340 B1  6/2006  Tsai et al.
(Continued)

*Primary Examiner* — Matthew L Reames
(74) *Attorney, Agent, or Firm* — Perkins Coie LLP

(57) ABSTRACT

Semiconductor device assemblies having solid-state transducer (SST) devices and associated semiconductor devices, systems, and are disclosed herein. In one embodiment, a method of forming a semiconductor device assembly includes forming a support substrate, a transfer structure, and a plurality semiconductor structures between the support substrate and the transfer structure. The method further includes removing the support substrate to expose an active surface of the individual semiconductor structures and a trench between the individual semiconductor structures. The semiconductor structures can be attached to a carrier substrate that is optically transmissive such that the active surface can emit and/or receive the light through the carrier substrate. The individual semiconductor structures can then be processed on the carrier substrate with the support substrate removed. In some embodiments, the individual semiconductor structures are singulated from the semiconductor device assembly and include a section of the carrier substrate attached to each of the individual semiconductor structures.

17 Claims, 9 Drawing Sheets

Related U.S. Application Data division of application No. 13/747,182, filed on Jan. 22, 2013, now Pat. No. 9,054,235.

(51) Int. Cl.

| | |
|---|---|
| *H01L 31/0236* | (2006.01) |
| *H01L 31/0352* | (2006.01) |
| *H01L 25/16* | (2006.01) |
| *H01L 25/075* | (2006.01) |
| *H01L 33/06* | (2010.01) |
| *H01L 33/22* | (2010.01) |
| *H01L 33/32* | (2010.01) |
| *H01L 33/48* | (2010.01) |
| *H01L 33/62* | (2010.01) |
| *H01L 27/146* | (2006.01) |

(52) U.S. Cl.
CPC .......... *H01L 31/02* (2013.01); *H01L 31/0236* (2013.01); *H01L 31/035209* (2013.01); *H01L 33/06* (2013.01); *H01L 33/22* (2013.01); *H01L 33/32* (2013.01); *H01L 33/486* (2013.01); *H01L 33/62* (2013.01); *H01L 27/14687* (2013.01); *H01L 33/0079* (2013.01); *H01L 2924/0002* (2013.01); *Y02E 10/50* (2013.01)

(56) References Cited

U.S. PATENT DOCUMENTS

| | | | |
|---|---|---|---|
| 7,488,621 | B2 | 2/2009 | Epler et al. |
| 7,968,379 | B2 | 6/2011 | Chu et al. |
| 8,207,539 | B2 | 6/2012 | Hsieh et al. |
| 8,329,481 | B2 | 12/2012 | Miyachi et al. |
| 8,329,482 | B2 | 12/2012 | Yao et al. |
| 8,575,004 | B2 | 11/2013 | Tsai et al. |
| 2002/0030194 | A1 | 3/2002 | Camras et al. |
| 2002/0030444 | A1 | 3/2002 | Muller-Mach et al. |
| 2002/0093023 | A1 | 7/2002 | Camras et al. |
| 2004/0115849 | A1 | 6/2004 | Iwafuchi et al. |
| 2008/0197378 | A1 | 8/2008 | Kong et al. |
| 2009/0085052 | A1 | 4/2009 | Ko et al. |
| 2009/0093075 | A1 | 4/2009 | Chu et al. |
| 2010/0046221 | A1 | 2/2010 | Posselt et al. |
| 2010/0090240 | A1 | 4/2010 | Tamboli et al. |
| 2010/0176410 | A1 | 7/2010 | Furuyama et al. |
| 2010/0283074 | A1 | 11/2010 | Kelley et al. |
| 2010/0320479 | A1 | 12/2010 | Minato et al. |
| 2011/0171762 | A1 | 7/2011 | West |
| 2011/0266560 | A1 | 11/2011 | Yao et al. |
| 2012/0146066 | A1 | 6/2012 | Tischler et al. |
| 2012/0231560 | A1 | 9/2012 | Hsieh et al. |
| 2012/0241927 | A1 | 9/2012 | Koo et al. |
| 2014/0203239 | A1 | 7/2014 | Schubert et al. |

SOLID-STATE TRANSDUCER DEVICES WITH OPTICALLY-TRANSMISSIVE CARRIER SUBSTRATES AND RELATED SYSTEMS, METHODS, AND DEVICES

CROSS-REFERENCE TO RELATED APPLICATION

This application is a continuation of U.S. application Ser. No. 14/706,827 filed May 7, 2015, which is a divisional of U.S. application Ser. No. 13/747,182 filed Jan. 22, 2013, now U.S. Pat. No. 9,054,235, each of which is incorporated herein by reference in its entirety.

TECHNICAL FIELD

The present technology relates to solid-state transducer devices that emit and/or receive light and substrates for manufacturing such devices.

BACKGROUND

Mobile phones, personal digital assistants ("PDAs"), digital cameras, MP3 players, and other portable electronic devices utilize light-emitting diodes ("LEDs"), organic light-emitting diodes ("OLEDs"), polymer light-emitting diodes ("PLEDs"), and other solid-state transducer ("SST") devices for, e.g., backlighting. SST devices are also used for signage, indoor lighting, outdoor lighting, and other types of general illumination. FIG. 1A is a cross-sectional view of a conventional SST device 10 that includes a support substrate 20 carrying an LED structure 11 having an active region 14 between P-type and N-type semiconductor materials 15 and 16, respectively. The SST device 10 also includes a first contact 17 and a second contact 19 spaced laterally apart from the first contact 17. The first contact 17 typically includes a transparent and conductive material (e.g., indium tin oxide ("ITO")) through which light is emitted from the LED structure 11.

To simplify assembly on a substrate (e.g., a printed circuit board ("PCB")), an SST device can be configured as a "direct-attach" device. FIG. 1B shows a direct-attach SST device 22 coupled to a PCB 24 via the first and second contacts 17 and 19. In the direct-attach configuration, the first and second contacts 17 and 19 are bonded to corresponding contacts 26 and 28 at the PCB 24 (e.g., with a reflowed solder connection) to electrically and mechanically connect the SST device 22 to the PCB 24. As illustrated, the support substrate 20 (FIG. 1A) is omitted from the SST device 22 such that light can escape from an active surface 30 of the LED structure 11 that is opposite the first and second contacts 17 and 19. As such, the first and second contacts 17 and 19 can be manufactured from opaque materials (rather than transparent materials). Although simplifying assembly with the PCB 24, the direct-attach SST device 22 is challenging to manufacture because the device materials and structures are fragile and thus difficult to handle during manufacturing. For example, the LED structure 11 is thin and without the support substrate (e.g., a support wafer) the LED structure 11 is prone to warping and damage.

DETAILED DESCRIPTION

Specific details of several embodiments of semiconductor devices having optically-transmissive carrier substrates and associated systems and methods are described below. The term "semiconductor device" generally refers to a solid-state device that includes semiconductor material. Although described herein in the context of SST devices, embodiments of the present technology can also include other types of semiconductor devices, such as logic devices, memory devices, and diodes, among others. Further, the term "semiconductor device" can refer to a finished device or to an assembly or other structure at various stages of processing before becoming a finished device. The term "SST" generally refers to solid-state transducers that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can also include solid-state devices that convert electromagnetic radiation into electricity.

Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person having ordinary skill in the relevant art will also understand that the present technology may have additional embodiments, and that the present technology may be practiced without several of the details of the embodiments described herein with reference to FIGS. 2A-6. For ease of reference, throughout this disclosure identical reference numbers are used to identify similar or analogous components or features, but the use of the same reference number does not imply that the parts should be construed to be identical.

Indeed, in many examples described herein, identically-numbered parts are distinct in structure and/or function. Furthermore, the same shading may be used to indicate materials in cross section that can be compositionally similar, but the use of the same shading does not imply that the materials should be construed to be identical.

Figure 1A:
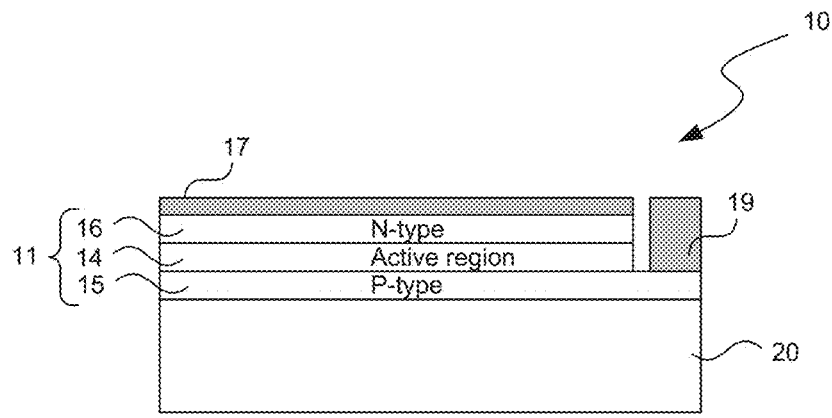
FIGS. 1A and 1B are partially schematic cross-sectional diagrams of SST devices in accordance with the prior art.
Figure 1B:
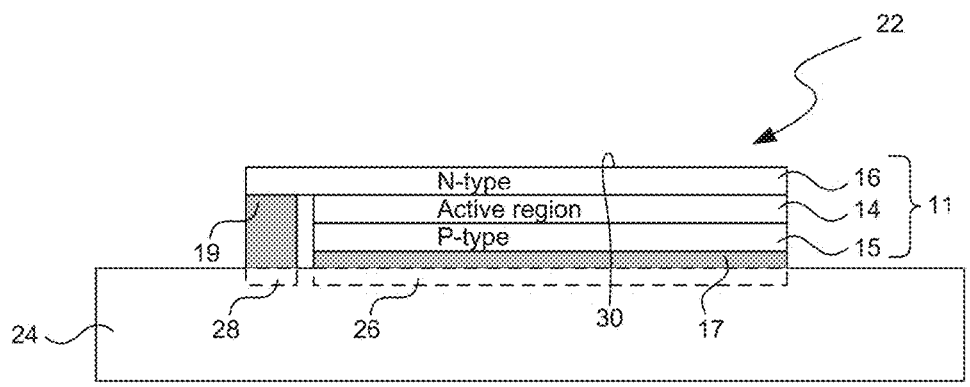
Figure 2A:
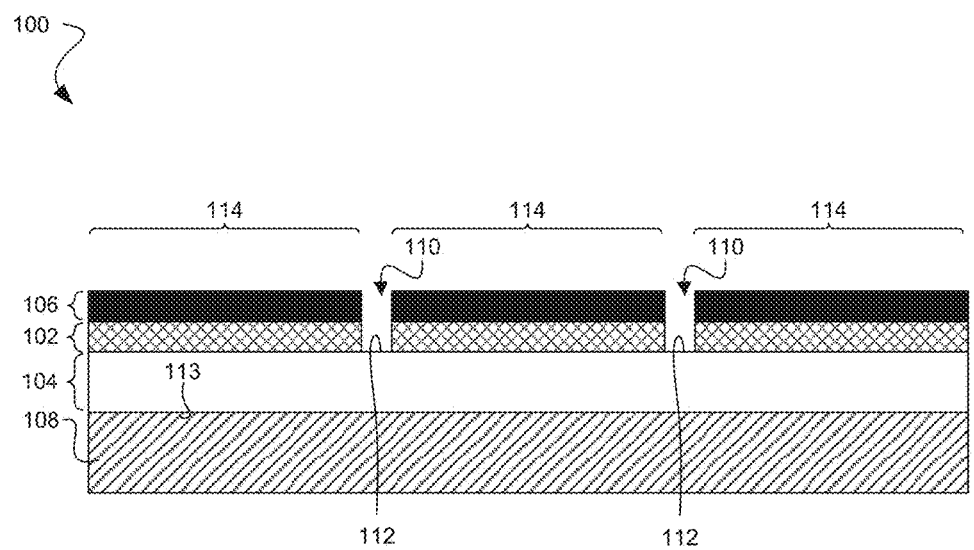
FIGS. 2A-2F are cross-sectional views illustrating a method of forming a semiconductor device assembly in accordance with selected embodiments of the present technology.

FIGS. 2A-2F are cross-sectional views of a semiconductor device assembly 100 in various stages of manufacture in accordance with selected embodiments of the present technology. FIG. 2A shows the semiconductor device assembly 100 after a semiconductor structure 104 has been formed on a support substrate 108 and a conductive material 102 has been formed on the semiconductor structure 104. At this stage, the semiconductor device assembly 100 also has a mask 106 on the conductive material 102. The mask 106 (e.g., a photoresist mask, a hard mask, or other suitable mask) has apertures that can be used in combination with an etch or other suitable material removal process to form openings 110 in the conductive material 102. As shown, the openings 110 expose surfaces 112 of the semiconductor structure 104. The openings 110 also define locations of individual semiconductor devices 114 in the semiconductor device assembly 100. As described in further detail below, the individual semiconductor devices 114 have an active surface 113 through which light is emitted and/or received during operation.

The conductive material 102 can include, for example, a metallic material, a doped semiconductor material, a combination of such materials, or other suitable conductive materials. The semiconductor structure 104 can include, for example, a single semiconductor material or a stack of different semiconductor materials. The support substrate 108 can be used to form the semiconductor structure 104 and the conductive material 102. For example, the support substrate 108 can include an engineered (handle) substrate of poly aluminum nitride, silicon carbine, or other suitable materials for epitaxial growth of semiconductor materials. Although omitted for purposes of clarity, the semiconductor device assembly 100 can include other materials or features. In one embodiment, the semiconductor device assembly 100 can include a through-substrate interconnect (not shown) that extends through the semiconductor structure 104 between the conductive material 102 and the support substrate 108. In this configuration, the through-substrate interconnect can provide an electrical connection with a transparent electrical (e.g., an indium tin oxide (ITO) electrode; not shown) at the active surface 113 of the individual semiconductor devices 114.

Figure 2B:
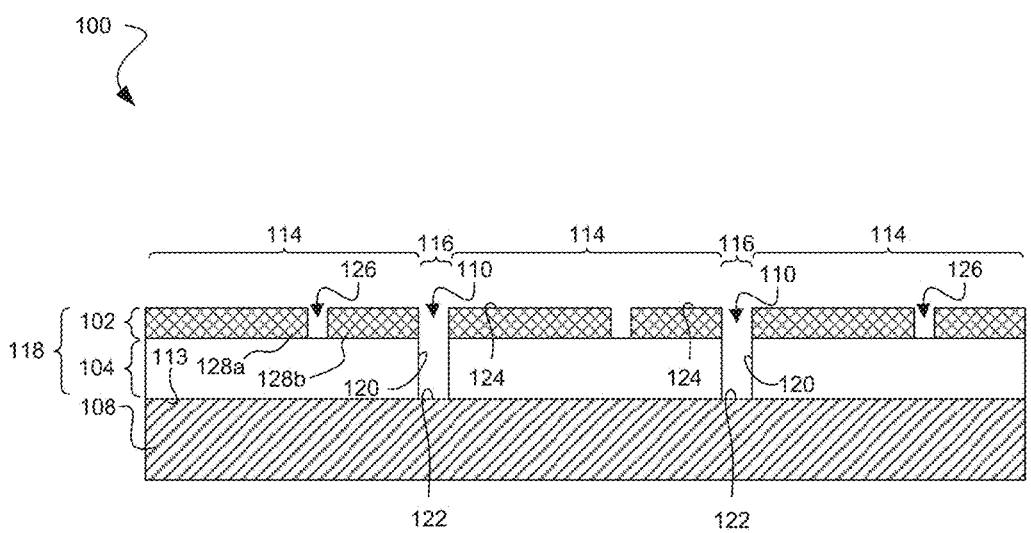

FIG. 2B shows the semiconductor device assembly 100 after forming first trenches 116 that extend through the conductive material 102 and into the semiconductor structure 104. An etch or other material removal process can form the first trenches 116 aligned with the openings 110 in the conductive material 102. As shown, the first trenches 116 define individual mesas 118 that include a portion of the conductive material 102 and a portion of the semiconductor structure 104 that are both separated from other mesas 118 of the semiconductor device assembly 100. The individual mesas 118 also include first sidewalls 120 that extend between exposed surfaces 122 of the support substrate 108 and contact surfaces 124 of the conductive material 102. In some embodiments, the mask 106 (FIG. 2A) can be used to define the locations of the first trenches 116. In other embodiments, the mask 106 can be removed before forming the first trenches 116. For example, a different mask can be used to form the first trenches 116 or the conductive material 102 itself can be used as a mask.

FIG. 2B also shows openings 126 formed in the conductive material 102 of the semiconductor device assembly 100. The openings 126 define contacts 128 (identified individually as first and second contacts 128a and 128b) on the semiconductor structure 104. In some embodiments, the openings 110 and 126 in the conductive material 102 can be formed (e.g., patterned and etched) simultaneously. For example, the openings 110 and 126 can be formed in a first stage, and the first trenches 116 can be formed in a second stage in which the openings 126 are covered by a mask and the openings 110 are not covered by a mask.

Figure 2C:
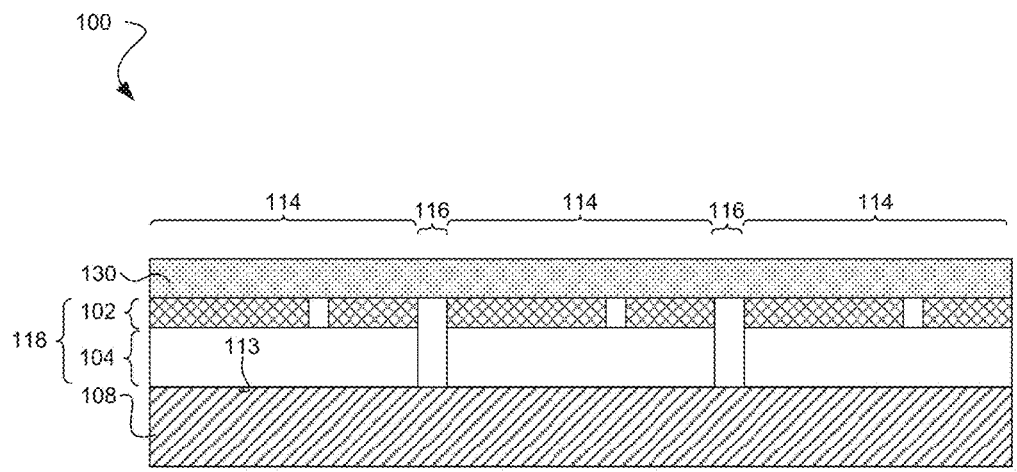

FIG. 2C shows the semiconductor device assembly 100 after a transfer structure 130 is attached to the conductive material 102 of the individual semiconductor devices 114. The transfer structure 130 can include an adhesive (not shown) for at least temporarily binding the individual semiconductor devices 114 to the transfer structure 130. In particular, a temporary transfer substrate 130 is configured to be removable at a later processing stage without damaging the semiconductor devices 114. For example, the transfer structure 130 can include a die-attach tape. Additionally or alternatively, the transfer structure 130 can be removed by a solvent that dissolves the adhesive material of the transfer structure 130. Removal of a temporary transfer structure 130 is illustrated, for example, in FIGS. 3A-3C. In general, the transfer structure 130 does not substantially degrade in acidic and/or basic solutions within a certain pH range. For example, the transfer structure 130 is configured such that it does not substantially degrade in the chemical etchant described below with reference to FIG. 2D.

Figure 2D:
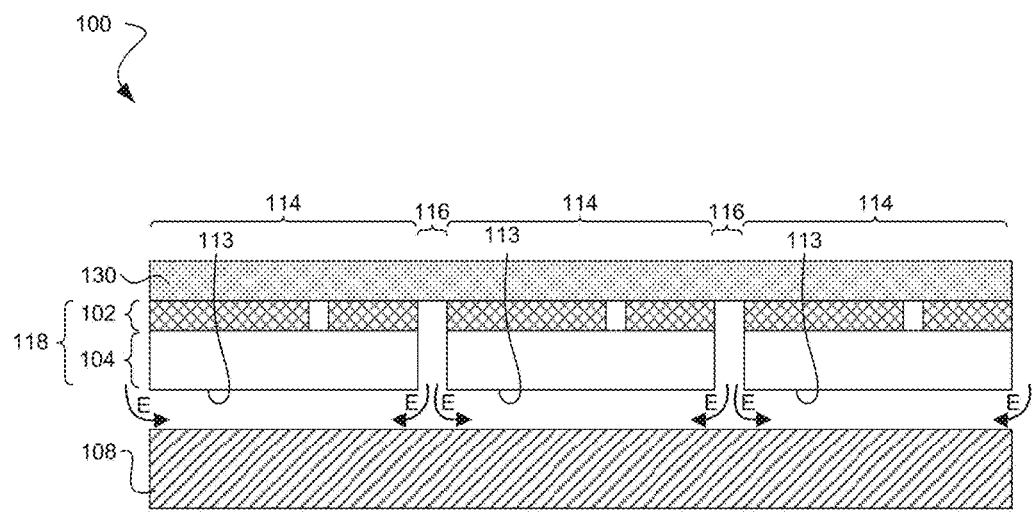

FIG. 2D shows the semiconductor device assembly 100 with the support substrate 108 removed from active surfaces 113 (e.g., light-emitting surfaces) of the individual semiconductor devices 114. In some embodiments, the semiconductor device assembly 100 can be placed into a bath of chemical etchant such that the etchant (drawn as arrows "E" in FIG. 2D) removes material from the interface between the support substrate 108 and the active surfaces 113 of the individual semiconductor devices 114. When the etchant sufficiently undercuts the support substrate 108 below the semiconductor structure 104, the support substrate 108 is released from the semiconductor device assembly 100. As shown, the etchant can access each side of the individual semiconductor devices 114 via the first trenches 116 between the individual semiconductor devices 114. Once released, the support substrate 108 can be recycled and used to form other semiconductor materials and devices. Alternatively, the support substrate 108 can be discarded depending on the life-cycle of the support substrate 108. For example, the support substrate 108 can be discarded if it has become too thin, contaminated, and/or cycled more than a pre-determined number of times. In other embodiments, the support substrate 108 can be removed by an alternative process, such as by backgrinding, etching, or chemical and mechanical polishing (e.g., CMP).

Figure 2E:
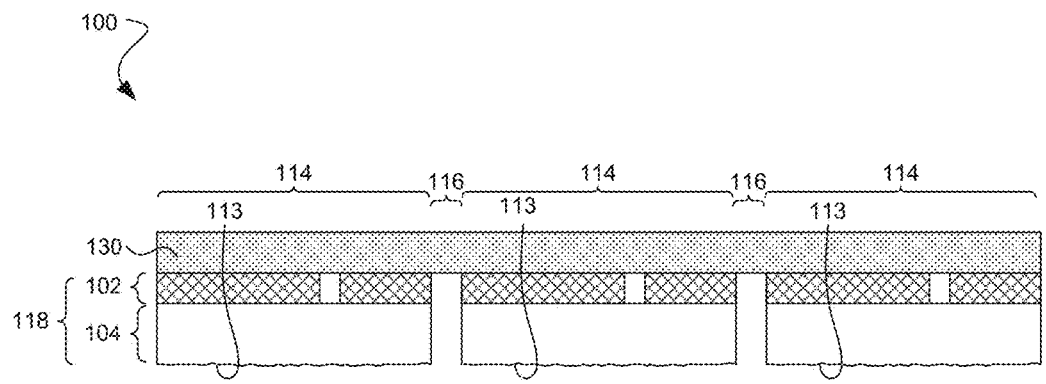

FIG. 2E shows the semiconductor device assembly 100 after roughening the active surfaces 113 of the individual semiconductor devices 114. For example, the semiconductor structure 104 can be placed in a different bath of chemical etchant that isotropically removes material from the active surface 113. In some embodiments, the roughed active surface 113 can improve light emission efficiency of the individual semiconductor devices 114 by reducing internal reflection. In addition or alternatively, the roughened active surface 113 can promote adhesion of other materials and structures with the semiconductor structure 104 of the individual semiconductor devices 114. In other embodiments, the active surfaces 113 are not roughened and accordingly the stage shown in FIG. 2E can be omitted.

Figure 2F:
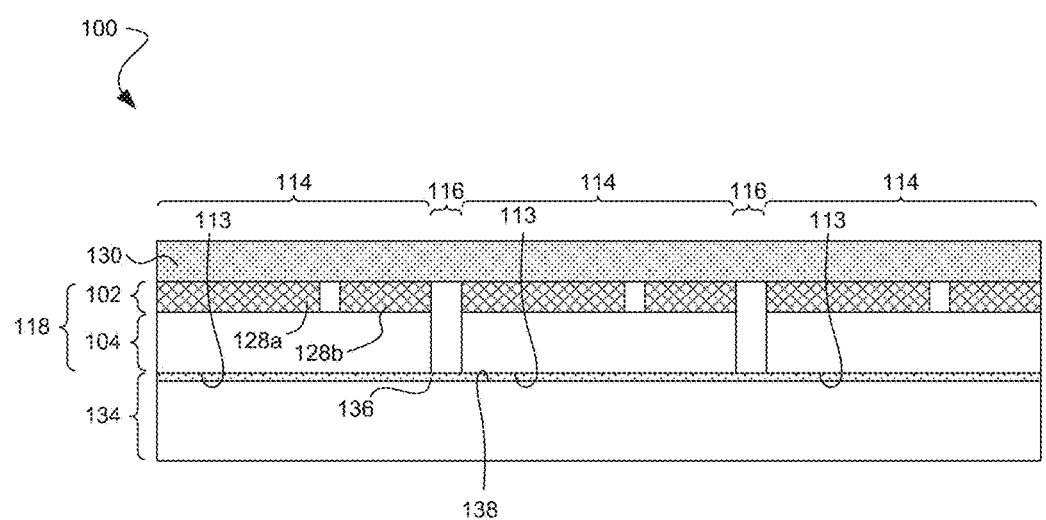

FIG. 2F shows the semiconductor device assembly 100 after attaching a carrier substrate 134 to the semiconductor structure 104 of the individual semiconductor devices 114. The carrier substrate 134 includes a material that is optically transmissive such that the active surfaces of the individual semiconductor devices 114 can emit and/or receive the light through the carrier substrate 134. For example, the carrier substrate 134 can be substantially transparent or substantially translucent to light in the visible spectrum (e.g., from about 390 nm to about 750 nm). The carrier substrate 134 can include, for example, a flexible polymeric material, a glass material (e.g., silicon dioxide or sapphire), a combination of optically transmissive materials, or other suitable materials. In one embodiment, the carrier substrate 134 includes a glass material having a reflective coating.

As illustrated in FIG. 2F, an intermediary material 136 can attach the carrier substrate 134 to the active surfaces 113 of the individual semiconductor devices 114. The intermediary material 136 can include, for example, an adhesive, epoxy, or other suitable bonding material. The intermediary material 136 can be selectively deposited on the active surface such that it does not substantially interfere with the transmission of light through the carrier substrate 134. For example, an adhesive can be screen printed at the periphery of the active surfaces 113 of the individual semiconductor devices 114. The intermediary material 136 can be substantially transparent, or in other embodiments the intermediary material 136 can include a material that alters the light (e.g., a phosphor). In such cases, the intermediary material can be dispensed directly on the active surface 113 of the individual semiconductor devices 114 and/or a first surface 138 of the carrier substrate 134. For example, a bead of adhesive can be deposited or the adhesive can be screen printed.

Alternatively, the carrier substrate 134 can be bonded by fusing the carrier substrate 134 with the active surfaces 113 of the individual semiconductor devices 114. For example, the carrier substrate 134 can include a glass material that is fused with a native oxide or a deposited oxide of the semiconductor structure 104 of the individual semiconductor devices 114. As such, the intermediary material 136 can be eliminated or defined by a region of chemical bonding between the active surfaces 113 of the individual semiconductor devices 114 and the outer surface 138 of the carrier substrate 134.

In some embodiments, the transfer structure 130 can be removed from the contacts 128 of the individual semiconductor devices 114 before continuing to other processing stages. Alternatively, the transfer structure 130 can remain on the contacts 128 during subsequent processing stages. For example, the transfer structure 130 can shield the contacts 128 from contamination and debris associated with operator handling, device singulation, or laser scribing. The transfer structure 130 can also provide a diffusion barrier that mitigates oxidation of the contacts 128 of the individual semiconductor devices 114.

In accordance with various embodiments of the present technology, the carrier substrate 134 provides mechanical support for carrying and protecting individual semiconductor devices. In particular, the carrier substrate 134 can be suited for direct-attach manufacturing techniques. For example, semiconductor devices incorporating the carrier substrate (e.g., after die singulation) can have contacts that are suited for direct bonding, such as eutectic bonding to a printed circuit board (PCB) or other suitable substrate. As discussed above, direct attach devices can be fragile and difficult to handle during manufacturing. Conventional techniques to improve the strength of direct-attach devices involve the use of thick metal for the electrical contacts to support the thin semiconductor devices. However, metal deposition processes for forming the thick metal can be time intensive and expensive. Also, thick metal can produce large aspect ratios between individual electrical contacts. Further, in some instances the thick metal can exceed 100 μm in thickness to provide sufficient support, whereas the semiconductor materials can be less than 10 μm in thickness. This disparity in thickness can cause fracturing of the thinner semiconductor material during die singulation. Accordingly, in various embodiments the conductive material 102 and corresponding electrical contacts 128 formed therein can be thinner than the contacts of conventional direct-attach devices.

Figure 3A:
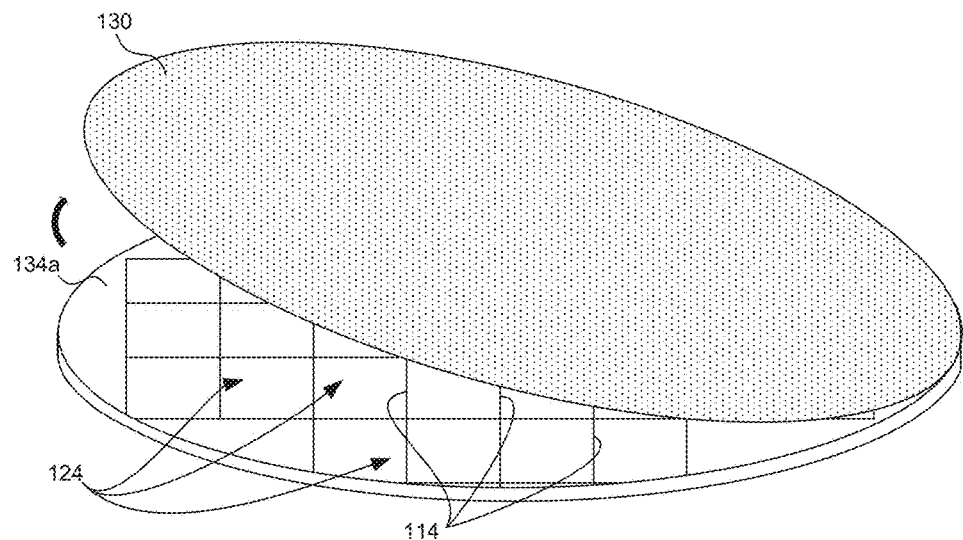
FIGS. 3A-3C are partially exploded, isometric views of various optically-transmissive carrier substrates that can be incorporated into a semiconductor device assembly in accordance with selected embodiments of the present technology.
Figure 3B:
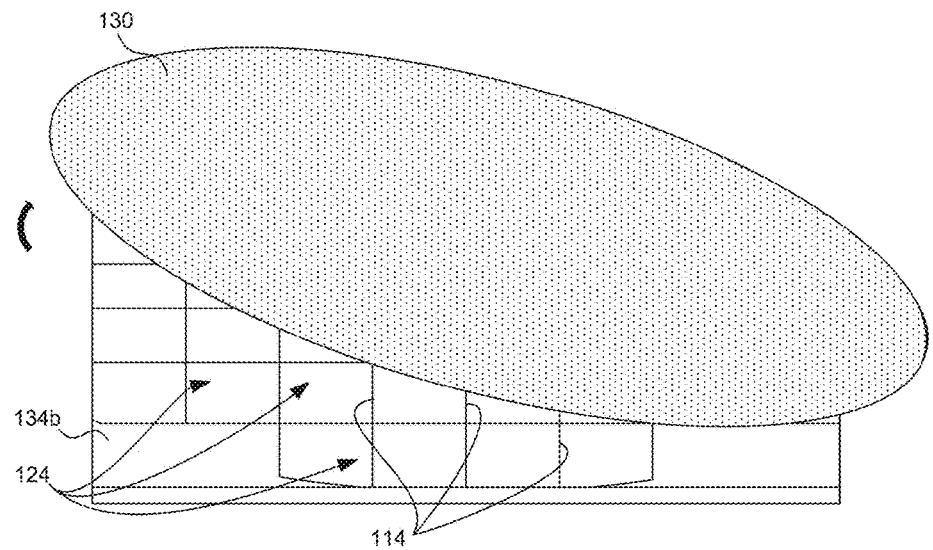
Figure 3C:
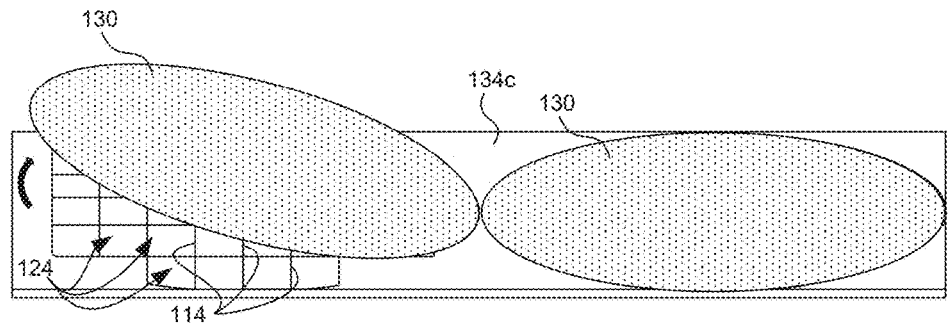

FIGS. 3A-3C show differently shaped carrier substrates 134 (identified individually as wafer-shaped, square-shaped, and rectangular-shaped carriers substrates 134a-134c, respectively). FIGS. 3A-3C also shows the transfer structure 130 being removed from the carrier substrates 134 to expose the contact surfaces 124 of the individual semiconductor devices 114. Referring first to FIG. 3A, the wafer-shaped carrier substrate 134a can be sized and shaped for compatibility with down-stream manufacturing equipment. For example, a vacuum wand, a chuck, and/or other mechanical component of a semiconductor processing tool can receive the wafer-shaped substrate 134a for further processing of the individual semiconductor devices 114. FIG. 3B shows the square-shaped carrier substrate 134b (e.g., a plate of square glass, a plate of polymeric material, or a plate of other suitable materials). Because the square-shaped carrier substrate 134b is not circular, it may be less complicated to manufacture than the wafer-shaped carrier substrate 134a of FIG. 3A. FIG. 3C shows the rectangular-shaped carrier substrate 134c. In this configuration, the carrier substrate 134c carries individual semiconductor devices 114 transferred from multiple transfer structures 130. Accordingly, it is expected that such a configuration can provide a higher throughput relative to the wafer-shaped and square-shaped carrier substrates 134a and 134b of FIGS. 3A and 3B, respectively. In these and other embodiments, the carrier substrate 134 can have other configurations that facilitate further processing stages of the individual semiconductor devices 114. Such processing stages can include electrical testing of the individual semiconductor devices 114 on the carrier substrate 134 and/or singulation of the individual semiconductor devices from the semiconductor substrate assembly 100. In certain non-illustrated embodiments, processing stages can also forming a transparent electrode (e.g., an ITO electrode) at the active surface 113 of the individual semiconductor devices 114.

Figure 4A:
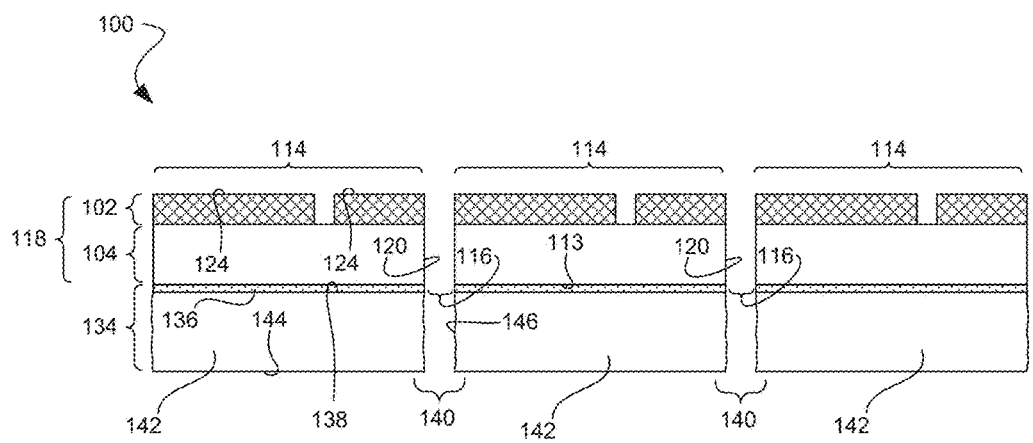
FIGS. 4A-4C are cross-sectional views illustrating singulation of semiconductor devices from a semiconductor device assembly having an optically-transmissive carrier substrate in accordance with selected embodiments of the present technology.
Figure 4B:
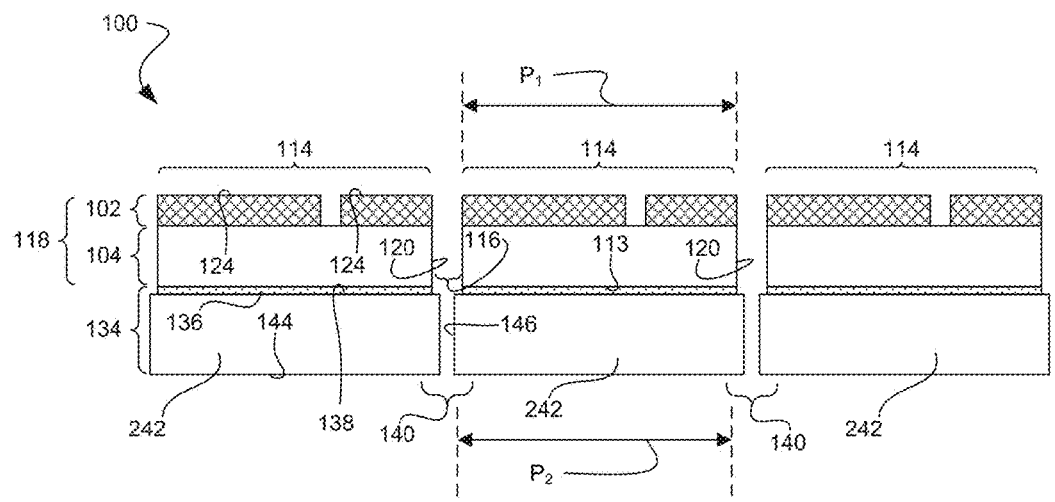
Figure 4C:
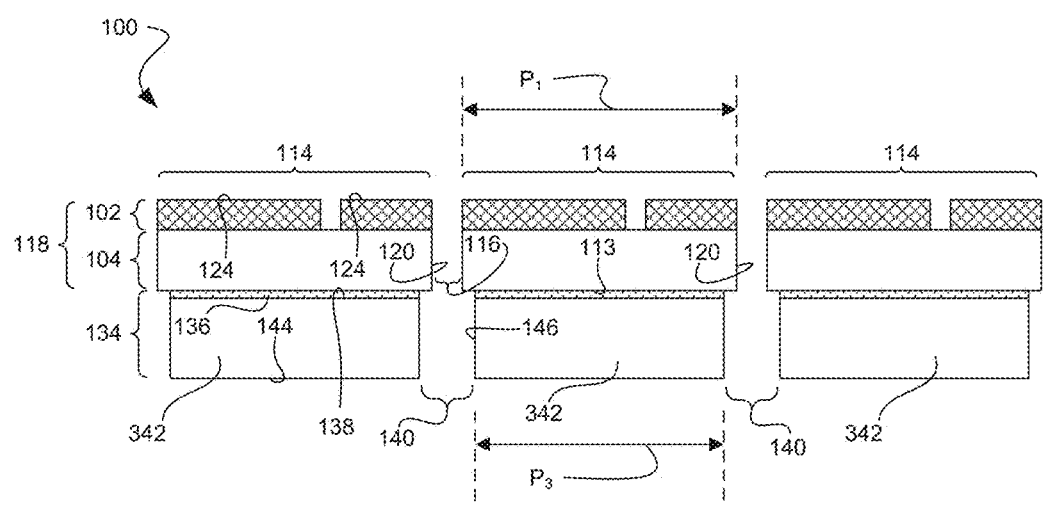

FIGS. 4A-4C are cross-sectional views of the semiconductor device assembly 100 in various stages of device singulation. Each of the processing stages of FIG. 4A-4C may occur, for example, after the processing stage of FIG. 2F. FIG. 4A shows the semiconductor device assembly 100 after forming second trenches 140 in the carrier substrate 134 to singulate the individual semiconductor devices 114 from the semiconductor device assembly 100. The second trenches 140 form separate sections 142 of the carrier substrate 134 that remain attached to the semiconductor structure 104 of the individual semiconductor devices 114. The second trenches 140 can be formed by a variety of mechanical singulation techniques, including blade cutting, wafer sawing, or laser ablation, among others. Device singulation can also include other suitable techniques, such as chemically etching the second trenches 140 in the carrier substrate 134.

In some embodiments, mechanical singulation includes forming the second trenches 140 through a first surface 138 of the carrier substrate 134. In certain instances, however, mechanical singulation techniques can create topographical artifacts at the first side walls 120 of the first trenches 116 (not shown in FIG. 4A). For example, mechanical singulation can create indentations (e.g., from blade or saw marks) at the first side walls 120 of the first trenches 116 (not shown in FIG. 4A). In some of these instances, the topographical artifacts may not have a significant (or any) impact on the operating performance of the individual semiconductor devices 114. In other embodiments, the carrier substrate 134 can be singulated through a second surface 144 of the carrier substrate 134 that is opposite the first surface 138 and such that the second trenches 140 are substantially aligned (e.g., generally in parallel) with the first trenches 116. As shown in FIG. 4A, second sidewalls 146 in the second trenches 140 are often relatively rougher than the first sidewalls 120 of the first trenches 116. The first sidewalls 120 of the individual semiconductor devices 114 can be smoother than the second sidewalls 146 of the second trenches 140 because the first sidewalls 120 can be formed chemically (e.g., an etch) as opposed to mechanically.

Similar to FIG. 4A, FIGS. 4B and 4C show the semiconductor device assembly 100 after forming second trenches 140 in the carrier substrate 134. FIGS. 4B and 4C are different than FIG. 4A in that the individual mesas 118 of the individual semiconductor devices 114 have a first planform shape $P_1$ that is different planform shape than the carrier substrate 134. Referring first to FIG. 4B, sections 242 of the carrier substrate 134 have a second planform shape $P_2$ that is larger than the first planform shape $P_1$ of the individual mesas 118. In such a configuration, a portion of the carrier substrate 134 extends laterally beyond the first sidewalls 136 of the individual semiconductor devices 114. FIG. 4C shows sections 342 of the carrier substrate 134 having a third planform shape $P_3$ that is larger than the first planform shape $P_1$ of the individual mesas 118. In such a configuration, a portion of the individual mesas 118 extends laterally beyond the second sidewalls 146 of the carrier substrate 134. In general, the planform shapes of the individual mesas 118 and the carrier substrate 134 can be sized according to the particular configuration of the individual semiconductor devices 114. For example, the second (larger) planform shape $P_2$ of the carrier substrate section 242 shown in FIG. 4B can insure that the carrier substrate 134 completely covers the active surface 113 of the semiconductor structure 104. In some embodiments, however, the size of planform shapes can be limited by a singulation process. For example, the third (smaller) planform shape $P_3$ of the carrier substrate section 342 shown in FIG. 4C can be caused by a wafer saw having a blade that is substantially wider than the first trench 116 between the individual mesas 118 of the individual semiconductor devices 114.

Figure 5:
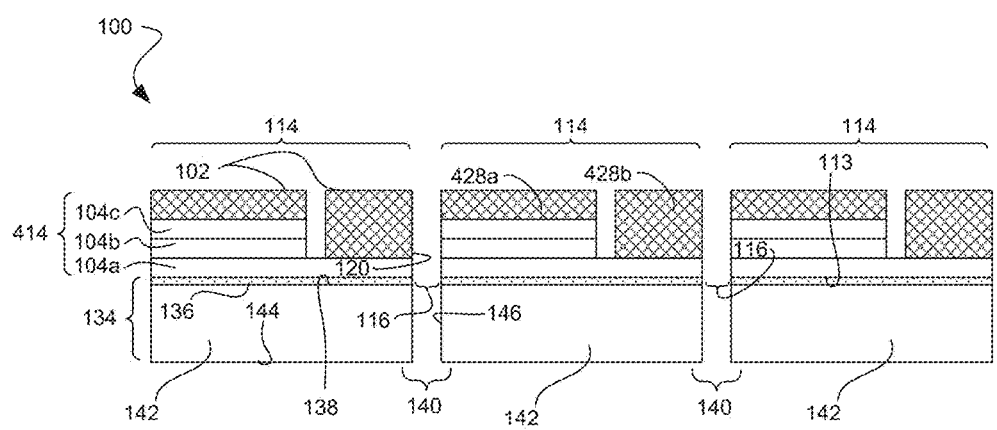
FIG. 5 is a cross-sectional view of an SST structure incorporating an optically-transmissive carrier substrate in accordance with selected embodiments of the present technology.

FIG. 5 is a cross-sectional view of the semiconductor device assembly 100 having SST structures 414. The individual SST structures 414 include the conductive material 102 and the semiconductor structure 104, and the semiconductor structure 104 can include first through third semiconductor materials 104a-104c. In some embodiments, the SST structure 414 can be configured to emit and/or receive light in the visible spectrum (e.g., from about 390 nm to about 750 nm) through the carrier substrate 134. In other embodiments, the SST structure 414 can also be configured to emit and/or receive light in the infrared spectrum (e.g., from about 1050 nm to about 1550 nm) and/or in other suitable spectra provided that the carrier substrate 134 is optically transmissive to such spectra.

In one embodiment, the first semiconductor material 104a can include an N-type semiconductor (e.g., an N-type gallium nitride ("N-GaN")) and the third semiconductor material 104c can include a P-type semiconductor material (e.g., a P-type gallium nitride ("P-GaN")). In selected embodiments, the first and third semiconductor materials 104a and 104c can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials. The second semiconductor material 104b can define an "active region" that includes a single quantum well ("SQW"), MQWs, and/or a bulk semiconductor material. The term "bulk semiconductor material" generally refers to a single grain semiconductor material (e.g., InGaN) with a thickness between approximately 10 nanometers and approximately 500 nanometers. In certain embodiments, the active region can include an InGaN SQW, GaN/InGaN MQWs, and/or an InGaN bulk material. In other embodiments, the active region can include aluminum gallium indium phosphide (AlGaInP), aluminum gallium indium nitride (AlGaInN), and/or other suitable materials or configurations.

The SST structure 414 can be formed via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques. In other embodiments, the SST structure 414 can also include other suitable components, such as a buffer material that facilitates the formation of the semiconductor structure 104 on the support substrate 108 (FIG. 2A). In further embodiments, the SST structure 414 can include additional bonding and seed layers to facilitate bonding and/or epitaxial growth.

Once formed, the SST structure 414 can be integrated into an SST device. For example, first and second contacts 428a and 428b of the SST structure 414 can be directly attached to a printed circuit board or other suitable substrate. Also, other features can be formed on or integrated into the SST structure, such as a lens over the carrier substrate 134 of the SST structure 414, an anti-reflective coating or a mirror, and/or other suitable mechanical/electrical components (not shown).

Figure 6:
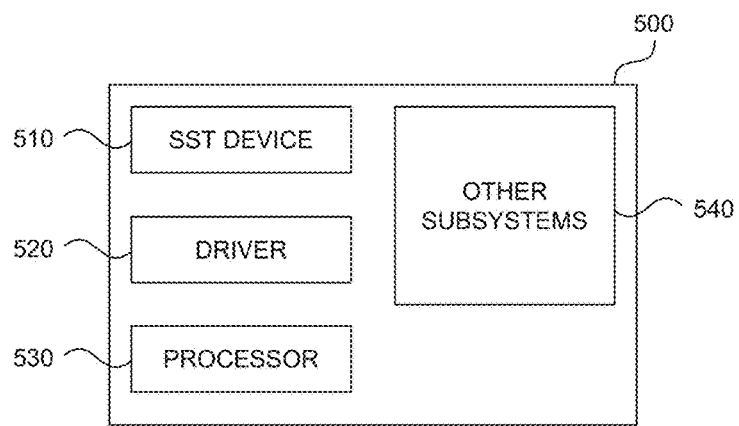
FIG. 6 is a schematic view of a system that includes a semiconductor device configured in accordance with selected embodiments of the present technology.

The semiconductor device assembly 100 described above with reference to FIGS. 2A-5 can be used to form SST devices, SST structures, and/or other semiconductor structures that are incorporated into any of a myriad of larger and/or more complex devices or systems, a representative example of which is system 500 shown schematically in FIG. 6. The system 500 can include one or more semiconductor/SST devices 510, a driver 520, a processor 530, and/or other subsystems or components 540. The resulting system 500 can perform any of a wide variety of functions, such as backlighting, general illumination, power generations, sensors, and/or other suitable functions. Accordingly, representative systems can include, without limitation, hand-held devices (e.g., mobile phones, tablets, digital readers, and digital audio players), lasers, photovoltaic cells, remote controls, computers, and appliances. Components of the system 500 may be housed in a single unit or distributed over multiple, interconnected units (e.g., through a communications network). The components of the system 500 can also include local and/or remote memory storage devices, and any of a wide variety of computer readable media.

From the foregoing, it will be appreciated that specific embodiments of the technology have been described herein for purposes of illustration, but that various modifications may be made without deviating from the disclosure. Certain aspects of the present technology described in the context of particular embodiments may also be combined or eliminated in other embodiments. Additionally, while advantages associated with certain embodiments of the present technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A method of forming a semiconductor device assembly, the method comprising:
    providing a semiconductor device assembly including a support substrate, a semiconductor structure attached to the support substrate, and conductive material attached to the semiconductor structure;
    forming at least one trench that extends through the semiconductor structure to form individual semiconductor devices, the individual semiconductor devices being attached to one another via the support substrate, wherein the at least one trench separates the individual semiconductor devices from one another, and wherein the individual semiconductor devices include a first side adjacent the conductive material, and a second side opposite the first side and adjacent the support substrate;
    after forming the at least one trench, attaching a transfer structure to the conductive material at the first side of the individual semiconductor devices;
    after attaching the transfer structure, removing the support substrate from the individual semiconductor devices using a chemical etchant;
    after removing the support substrate, coupling a carrier substrate to an active surface of the individual semiconductor devices at the second side of the individual semiconductor devices, wherein the carrier substrate is optically transmissive to light; and
    processing the individual semiconductor devices on the carrier substrate.

2. The method of claim 1, further comprising, prior to coupling the carrier substrate, roughening the active surface of the individual semiconductor devices to improve light emission efficiency therefrom.

3. The method of claim 1 wherein coupling a carrier substrate comprises:
    disposing an optically-transmissive intermediary material over the active surface of the individual semiconductor devices; and
    attaching the carrier substrate to the intermediary material.

4. The method of claim 1, further comprising forming openings in the conductive material such that portions of the semiconductor material of the individual semiconductor devices are exposed, wherein forming the openings separates the conductive material of the individual semiconductor devices into a first contact and a second contact.

5. The method of claim 4 wherein attaching a transfer structure comprises attaching the transfer structure to contact surfaces of the first and second contacts, wherein the transfer structure covers the first and second contacts and the one or more trenches.

6. The method of claim 1 wherein processing the individual semiconductor devices comprises singulating the semiconductor device assembly along dicing lines generally aligned with the at least one trench.

7. The method of claim 1 wherein the at least one trench includes at least one first trench, and wherein processing the individual semiconductor devices comprises forming at least one second trench extending through the carrier substrate to form sections of the carrier substrate, wherein the at least one second trench is aligned with the at least one first trench.

8. The method of claim 7 wherein—
    the individual semiconductor devices include first sidewalls formed by the at least one first trench,
    individual sections of the carrier substrate include second sidewalls formed by the at least one second trench, and
    the second sidewalls are positioned laterally outwardly from corresponding first sidewalls.

9. The method of claim 7 wherein—
    the individual semiconductor devices include first sidewalls formed by the at least one first trench,
    individual sections of the carrier substrate include second sidewalls formed by the at least one second trench, and
    the first sidewalls are positioned laterally outwardly from corresponding second sidewalls.

10. A method of forming solid state transducer (SST) devices, the method comprising:
    providing a semiconductor device assembly including a support substrate, a stack of semiconductor materials attached to the support substrate, and conductive material attached to the semiconductor structure;
    removing portions of material from the stack of semiconductor materials and conductive material to form individual mesas, the individual mesas being attached to one another via the support substrate, wherein the individual mesas include a vertical sidewall extending from an active surface of the stack of semiconductor materials to a contact surface of the conductive material;
    after forming the individual mesas, attaching a transfer structure to the contact surface of the conductive material of the individual mesas, wherein the transfer structure extends laterally across the individual mesas;
    after attaching the transfer structure, removing the support substrate from the individual mesas using a chemical etchant to expose the active surface of the stack of semiconductor materials of the individual mesas; and
    after removing the support substrate, attaching an optically-transmissive material at the active surface of the individual mesas.

11. The method of claim 10, further comprising singulating the optically transmissive material to form individual SST devices.

12. The method of claim 11, further comprising:
    before attaching the optically-transmissive material, roughening the active surface of the stack of semiconductor materials.

13. The method of claim 10 wherein removing portions of material comprises removing first portions of material to form trenches that extend between and separate the individual mesas from one another, the method further comprising removing second portions of material from the conductive material to form first contacts and second contacts separated from the corresponding first contacts.

14. The method of claim 13 wherein removing first portions comprises (a) disposing a mask over the conductive material to define locations of the trenches, and (b) etching the first portions.

15. The method of claim 10 wherein attaching a transfer structure comprises attaching a die-attach tape.

16. The method of claim 1 wherein removing the support substrate using the chemical etchant includes undercutting the support substrate using the chemical etchant at the at least one trench.

17. The method of claim 10 wherein removing the support substrate using the chemical etchant includes undercutting the support substrate using the chemical etchant at the removed portions from the stack of semiconductor materials.

\* \* \* \* \*